United States Patent
Kawada et al.

(10) Patent No.: US 10,186,575 B2
(45) Date of Patent: Jan. 22, 2019

(54) SILICON CARBIDE SEMICONDUCTOR DEVICE AND A METHOD OF MANUFACTURING A SILICON CARBIDE SEMICONDUCTOR DEVICE

(71) Applicants: FUJI ELECTRIC CO., LTD., Kawasaki-shi, Kanagawa (JP); MITSUBISHI ELECTRIC CORPORATION, Tokyo (JP)

(72) Inventors: Yasuyuki Kawada, Tsukuba (JP); Shiyang Ji, Tsukuba (JP); Ryoji Kosugi, Tsukuba (JP); Hidenori Koketsu, Tokyo (JP); Kazuhiro Mochizuki, Tsukuba (JP)

(73) Assignees: FUJI ELECTRIC CO., LTD., Kawasaki-Shi, Kanagawa (JP); MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/903,181

(22) Filed: Feb. 23, 2018

(65) Prior Publication Data
US 2018/0248002 A1 Aug. 30, 2018

(30) Foreign Application Priority Data
Feb. 28, 2017 (JP) .................. 2017-037763

(51) Int. Cl.
| | |
|---|---|
| *H01L 29/78* | (2006.01) |
| *H01L 29/06* | (2006.01) |
| *H01L 29/16* | (2006.01) |
| *H01L 29/10* | (2006.01) |
| *H01L 29/66* | (2006.01) |

(Continued)

(52) U.S. Cl.
CPC ........ *H01L 29/0634* (2013.01); *H01L 21/046* (2013.01); *H01L 21/0475* (2013.01); *H01L 29/1095* (2013.01); *H01L 29/1608* (2013.01); *H01L 29/66068* (2013.01); *H01L 29/66348* (2013.01); *H01L 29/66621* (2013.01); *H01L 29/66734* (2013.01); *H01L 29/7811* (2013.01); *H01L 29/7813* (2013.01); *H01L 29/7825* (2013.01); *H01L 29/7827* (2013.01); *H01L 29/4236* (2013.01); *H01L 29/7802* (2013.01)

(58) Field of Classification Search
None
See application file for complete search history.

(56) References Cited

U.S. PATENT DOCUMENTS

| 7,535,059 B2* | 5/2009 | Yoshikawa | ......... H01L 29/0634 257/341 |
|---|---|---|---|
| 2004/0056306 A1 | 3/2004 | Saito et al. | |
| 2014/0306283 A1* | 10/2014 | Nakajima | ........... H01L 29/7827 257/329 |

FOREIGN PATENT DOCUMENTS

JP 2004-119611 A 4/2004

* cited by examiner

*Primary Examiner* — Minh-Loan Tran
(74) *Attorney, Agent, or Firm* — Rabin & Berdo, P.C.

(57) ABSTRACT

In a silicon carbide semiconductor device, an n-type drift layer is formed on a front surface of an $n^{++}$-type semiconductor substrate. Next, a trench is formed in the n-type drift layer, from a surface of the n-type drift layer. Next, a p-type pillar region is formed in the trench. A depth of the trench is at least three times a width of the trench. The p-type pillar region is formed by concurrently introducing a p-type first dopant and a gas containing an n-type second dopant incorporated at an atom position different from that of the first dopant.

6 Claims, 13 Drawing Sheets

(51) Int. Cl.
*H01L 21/04* (2006.01)
*H01L 29/423* (2006.01)

$10^{18}$ $10^{15}$

SILICON CARBIDE SEMICONDUCTOR DEVICE AND A METHOD OF MANUFACTURING A SILICON CARBIDE SEMICONDUCTOR DEVICE

TECHNICAL FIELD

The present invention relates to a silicon carbide semiconductor device and a method of manufacturing a silicon carbide semiconductor device.

BACKGROUND ART

Metal oxide semiconductor field effect transistors (MOSFETs) that break conventional characteristics limitations are being developed using a superjunction structure. In fabricating (manufacturing) these superjunction MOSFETs (SJ-MOSFETs), epitaxial layers are separately grown on a semiconductor substrate multiple times, and at each growth session, alternating parallel p-type regions and n-type regions are repeatedly formed by patterning and ion implantation. At the time of the repeated epitaxial growth and the patterning and ion implantation, regions of the same type among the p-type regions and the n-type regions are connected in a thickness direction, forming a pn column structure extending in a direction orthogonal to a main surface of the substrate is a most characterizing aspect of a method of manufacturing a so-called superjunction semiconductor device. A method of manufacturing a superjunction MOSFET having a pn column structure formed by such a method is referred to as a multi epitaxial method. Nonetheless, this technique has issues in that processes are complex, manufacturing cost is high, and chip cost is high.

On the other hand, recently, a method of manufacturing a superjunction MOSFET by a technique that embeds an epitaxial layer in a trench and reduces manufacturing cost is being developed. FIG. 16 is a cross-sectional view of a structure of a conventional superjunction MOSFET. As depicted in FIG. 16, a superjunction MOSFET uses a wafer in which an n-type drift layer 102 is grown on an $n^{++}$-type semiconductor substrate 101 of a high impurity concentration. A p-type pillar region 103 is provided from a surface of this wafer. The p-type pillar region 103 penetrates the n-type drift layer 102 and does not reach the $n^{++}$-type semiconductor substrate 101. In FIG. 16, although the p-type pillar region 103 does not reach the $n^{++}$-type semiconductor substrate 101, the p-type pillar region 103 may reach the $n^{++}$-type semiconductor substrate 101.

According to one method, as a semiconductor material, a 4-layer periodic hexagonal silicon carbide (4H-SiC) is used and when the p-type pillar region 103 is formed, a trench is formed in the n-type drift layer 102 and a p-type impurity is re-embedded in the trench by epitaxial growth.

An n-type CS layer (carrier storage) 105 is provided on the n-type drift layer 102, and a p-type base layer 106 is provided at a surface of the n-type CS layer 105. A trench 1018 is provided at a front surface side of the p-type base layer 106. Along a side wall of the trench 1018, a gate insulating film 109 is provided, and a gate electrode 1010 is provided on the gate insulating film 109. A bottom of the trench 1018 is in contact with the p-type pillar region 103. Further, an $n^+$-type source region 107 and a $p^+$-type contact region 108 are provided in the p-type base layer 106. Further, a source electrode 1011 is provided on the $n^+$-type source region 107 and the $p^+$-type contact region 108, and a drain electrode 1012 is provided on a rear surface of the $n^{++}$-type semiconductor substrate 101.

In FIG. 16, a SJ layer 1021 has in the n-type drift layer 102, a parallel structure (hereinafter, parallel pn layer) in which a p-type region (the p-type pillar region 103) extending in a direction orthogonal to a main surface of the substrate and having a narrow width in a direction parallel to the main surface of the substrate and an n-type region (a part of the n-type drift layer 102 between p-type pillar regions 103) are arranged repeatedly alternating in a direction parallel to the main surface of the substrate. Even when the p-type regions and the n-type regions constituting the parallel pn layer are each low resistance regions formed from a high impurity concentration, the p-type regions and the n-type regions are set at an interval that is narrow to an extent that with a low breakdown voltage in an OFF state, a depletion layer spreading from pn junctions of all of the p-type regions and the n-type regions in the parallel pn layer promptly depletes the entire parallel pn layer. For example, as a charge balance of the p-type regions and the n-type regions, an arithmetic product of the width of the p-type pillar region 103 and the impurity concentration of the p-type pillar region 103 is substantially equal to an arithmetic product of the width of the n-type region and the impurity concentration of the n-type region. Therefore, the SJ layer 1021 is known as a structure that concurrently obtains both characteristics of low ON resistance and high breakdown voltage characteristics.

For example, according to one technique, in a superjunction semiconductor device, an impurity concentration of a p-RESURF layer is set so that distribution (sloped profile) thereof decreases in a depth direction, whereby a breakdown voltage decrease with respect to an amount of unbalance between an impurity amount of the p-RESURF layer and an impurity amount of the $n^-$-type drift layer is reduced as compared a conventional case (for example, refer to Patent Document 1).

PRIOR ART LITERATURE

[Patent document 1] Japanese Laid-Open Patent Publication No. 2004-119611

DISCLOSURE OF INVENTION

Problem to be Solved by the Invention

To realize a high-voltage superjunction MOSFET, it is effective to make a depth of the trench deep. Nonetheless, in this case, while a high-aspect-ratio (trench depth/trench width) trench has to be re-embedded with a p-type impurity, an impurity concentration of the re-embedded p-type epitaxial film is not uniform and thus, in the trench, a concentration distribution in which the impurity concentration differs greatly according to position (hereinafter, non-uniform concentration distribution) results.

FIG. 17 is a schematic diagram of a scanning microwave micrograph of a p-type epitaxial layer of a conventional superjunction MOSFET. Scanning microwave microscopy (SMM) is microscopy that via a solid metal probe, measures microwaves that have been reflected back to thereby measure changes in impedance of a test surface. In FIG. 17, in a sample for SMM analysis, a trench is formed directly in an $n^{++}$-type semiconductor substrate and a p-type epitaxial layer is re-embedded by epitaxial growth of a p-type impurity, and a concentration of a substrate part is an exponential value of the 18th power or more. FIG. 17 depicts a carrier concentration distribution of the p-type epitaxial layer formed using only trimethylaluminium (TMA: $(CH_3)_3Al$)

as a deposition gas. As depicted in FIG. 17, a part having a high carrier concentration is near a center of the trench and thus, non-uniform concentration distribution occurs in the trench.

FIG. 18 is a graph depicting a relationship of trench depth and Al concentration. FIG. 18 is an example of a case in which a p-type epitaxial layer is grown using aluminum (Al) as a p-type impurity and by constantly supplying only TMA as a deposition gas. The p-type epitaxial layer was evaluated by performing scanning nonlinear dielectric microscopy (SNDM) for carrier concentration in the trench and demonstrates a typical concentration distribution trend in a case of conversion to an Al concentration. Scanning nonlinear dielectric microscopy is microscopy developed to observe with high resolution and measure permittivity distribution of a ferroelectric material surface. As depicted in FIG. 18, the impurity concentration increases with proximity to an opening (top) of the trench and non-uniform concentration distribution in trench occurs.

In this manner, when non-uniform concentration distribution occurs in the p-type epitaxial layer in the trench, parallel pn layer design is difficult and, performance as a device and yield degrade. For example, design for realizing charge balance of the p-type regions and the n-type regions is difficult and when charge balance is not realized, both low ON resistance and high breakdown voltage characteristics are impossible to obtain concurrently.

To solve the problems associated with the conventional arts above, one object of the present invention is to provide a silicon carbide semiconductor device and a method of manufacturing a silicon carbide semiconductor device that are capable of reducing instances in which carrier concentration distribution of an epitaxial layer in a trench becomes non-uniform.

Means for Solving Problem

To solve the problems above and achieve an object of the present invention, a semiconductor device according to the present invention has the following characteristics. The silicon carbide semiconductor device includes a parallel pn layer having: a first semiconductor layer of a first conductivity type provided on a front surface of a silicon carbide semiconductor substrate of the first conductivity type; and a first semiconductor region of a second conductivity type embedded in a trench that is provided in the first semiconductor layer, from a surface of the first semiconductor layer. A depth of the trench is at least three times a width of the trench. The first semiconductor region is implanted with a first dopant of the second conductivity type determining a conductivity type of the first semiconductor region. The first semiconductor region is further implanted with a second dopant of the first conductivity incorporated at an atom position different from that of the first dopant. A carrier concentration of the first semiconductor region is uniform.

Further, the silicon carbide semiconductor device according to the present invention is characterized in that in the invention above, the carrier concentration of the first semiconductor region is $1 \times 10^{15}/cm^3$ to $5 \times 10^{17}/cm^3$.

To solve the problems above and achieve an object of the present invention, a method of manufacturing a semiconductor device according to the present invention has the following characteristics. The method of manufacturing a silicon carbide semiconductor device includes a first process of forming a first semiconductor layer of a first conductivity type on a front surface of a silicon carbide semiconductor substrate of the first conductivity type is performed. Next, a second process of forming a trench in the first semiconductor layer, from a surface of the first semiconductor layer is performed. Next, a third process of embedding a first semiconductor region of a second conductivity type in the trench is performed. At the second process, a depth of the trench is formed to be at least three times a width of the trench. Further, at the third process, a first dopant of the second conductivity type and a gas containing a second dopant of the first conductivity type and incorporated at an atom position different from that of the first dopant are introduced concurrently.

Further, the method of manufacturing a silicon carbide semiconductor device according to the present invention is characterized in that in the above invention, at the third process, the second dopant is not supplied until a thickness of the first semiconductor region deposited at a side wall of the trench becomes 0.2 μm and after the thickness becomes 0.2 μm, the second dopant is supplied.

Further, the method of manufacturing a silicon carbide semiconductor device according to the present invention is characterized in that in the above invention, at the third process, a flowrate of the gas from a start of supplying the second dopant until formation of the first semiconductor region is complete is gradually increased.

Further, the method of manufacturing a silicon carbide semiconductor device according to the present invention is characterized in that in the above invention, at the third process, an amount of the second dopant is reduced to be less than an amount of the first dopant, and a carrier concentration of the first semiconductor region is formed to be $1 \times 10^{15}/cm^3$ to $5 \times 10^{17}/cm^3$.

According to the present invention, when a first dopant is embedded in a trench and a p-type epitaxial film is formed, the flowrate of n-type nitrogen or phosphorus is arbitrarily controlled while the nitrogen or phosphorus is introduced as a second dopant. As a result, the p-type epitaxial film may be suppressed from having a high concentration near the center of the trench. Therefore, design of the semiconductor device is facilitated and, the performance and the yield of the semiconductor device may be further improved.

Further, nitrogen is not introduced at the initial stage of embedded growth of the p-type epitaxial film. As a result, nitrogen is not further incorporated and the carrier concentration distribution does not degrade near the sidewall of the trench.

Effect of the Invention

The silicon carbide semiconductor device and the method of manufacturing a silicon carbide semiconductor device according to the present invention achieve an effect in that instances in which carrier concentration distribution of an epitaxial layer in a trench becomes non-uniform may be reduced.

BEST MODE(S) OF CARRYING OUT THE INVENTION

Figure 1:
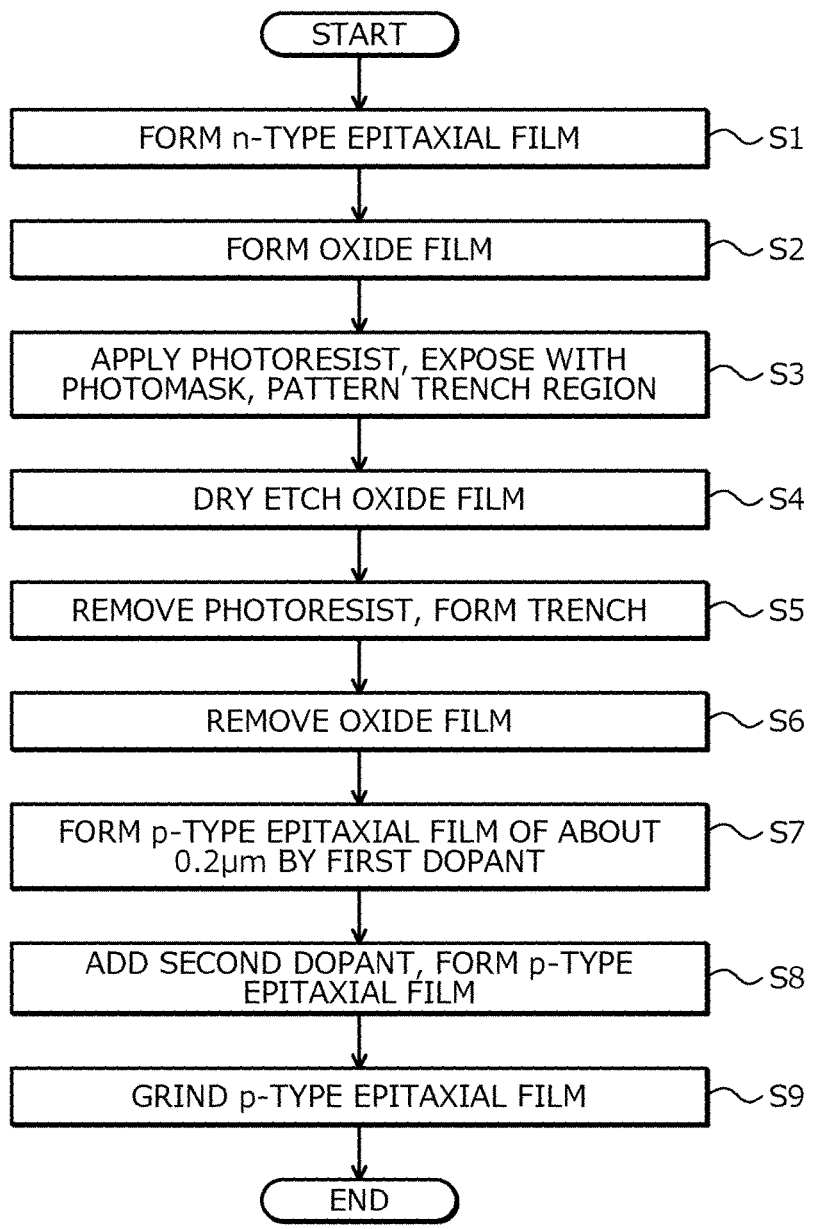
FIG. 1 is a flowchart of forming a SJ layer of a silicon carbide semiconductor device according to an embodiment.

Preferred embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

A semiconductor device according to the present invention is configured using a semiconductor material having a bandgap that is wider than a bandgap of silicon (hereinafter, wide bandgap semiconductor material). Here, a structure of a semiconductor device (silicon carbide semiconductor device) using, for example, silicon carbide (SiC) as a wide bandgap semiconductor material will be described as an example.

(Embodiment)

A structure of the silicon carbide semiconductor device according to the embodiment is similar to a structure of a conventional superjunction MOSFET. In the silicon carbide semiconductor device according to the embodiment, a p-type pillar region 3 is formed by a method described hereinafter, whereby a carrier concentration distribution of the p-type pillar region 3 is decreased. For example, in the p-type pillar region 3, a p-type dopant, for example, Al or boron (B), determining a conductivity type of the p-type pillar region 3 and an n-type dopant, for example, nitrogen ($N_2$) or phosphorus (P) are implanted, making a carrier concentration of the p-type pillar region 3 uniform. The carrier concentration of the p-type pillar region 3 is $1 \times 10^{15}/cm^3$ to $5 \times 10^{17}/cm^3$.

Further, in the embodiment, to realize a high breakdown voltage, a depth of a trench 19 (refer to FIG. 6, etc.) of the p-type pillar region 3 is deep. For example, an aspect ratio (trench depth/trench width) is 3 to 15. Here, the carrier concentration is a concentration ($N_A$-$N_D$) of a concentration ($N_A$) of the p-type impurity plus a concentration ($N_D$) of the n-type impurity included in the p-type pillar region 3.

(Method of Manufacturing Silicon Carbide Semiconductor Device According to Embodiment)

A method of manufacturing the silicon carbide semiconductor device according to the embodiment will be described. FIG. 1 is a flowchart of forming a SJ layer of the silicon carbide semiconductor device according to the embodiment. FIGS. 2 to 12 are cross-sectional views of the silicon carbide semiconductor device according to the embodiment during manufacture. Hereinafter, description is given according to the flowchart depicted in FIG. 1.

Figure 2:
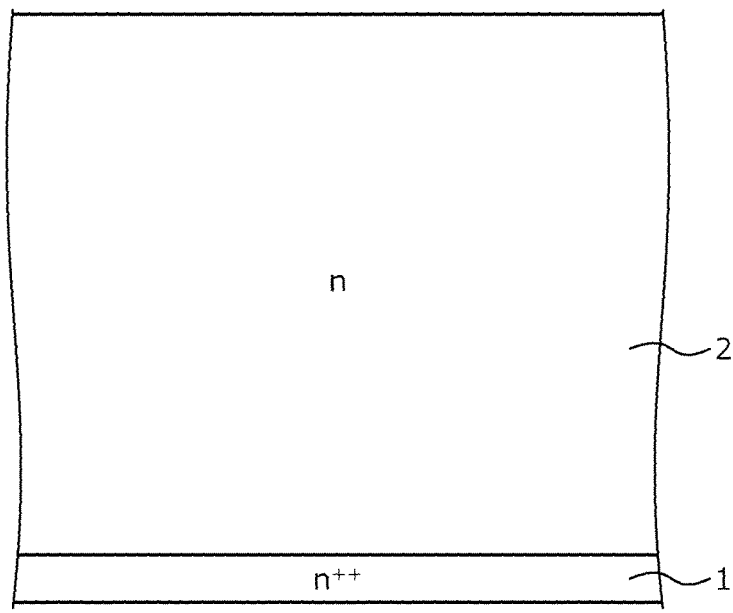
FIG. 2 is a cross-sectional view (part 1) of the silicon carbide semiconductor device according to the embodiment during manufacture.

First, an n-type epitaxial film is formed (step S1). An $n^{++}$-type semiconductor substrate (silicon carbide semiconductor substrate of a first conductivity type) 1 and containing 4H-SiC is prepared. The $n^{++}$-type semiconductor substrate 1 is cleaned well by organic cleaning and RCA cleaning (wet cleaning using strongly acidic and highly basic solutions), nitrogen is doped in a Si face at a predetermined concentration, and an n-type drift layer (first semiconductor layer of the first conductivity type) 2 having a thickness of 30 μm and an impurity concentration lower than an impurity concentration of the $n^{++}$-type semiconductor substrate 1 is formed by epitaxial growth. The state up to here is depicted in FIG. 2.

Figure 3:
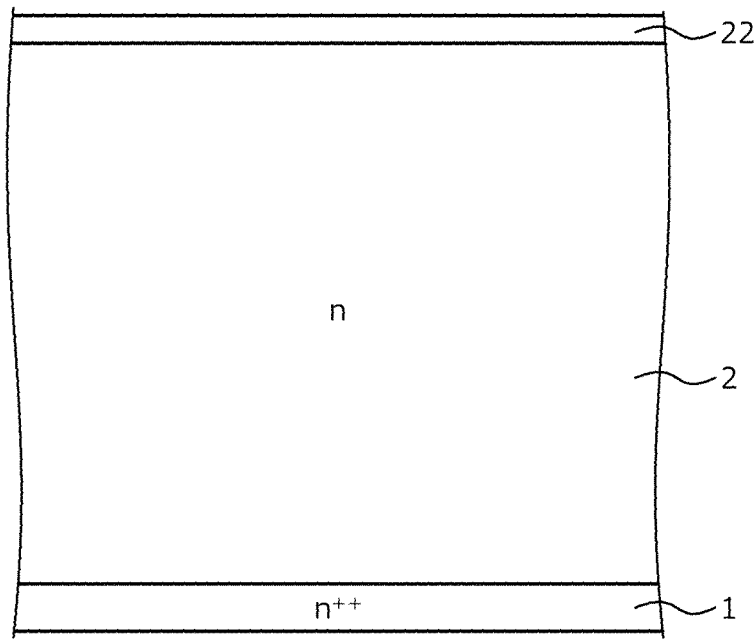
FIG. 3 is a cross-sectional view (part 2) of the silicon carbide semiconductor device according to the embodiment during manufacture.

Next, an oxide film is formed (step S2). After the $n^{++}$-type semiconductor substrate 1 is cleaned, an oxide film 22 containing silicon dioxide ($SiO_2$) is deposited by plasma chemical vapor deposition (CVD) or the like. A thickness of the oxide film 22 is a thickness necessary for a dry etching pattern mask for forming the trench 19, i.e., a thickness whereby the oxide film 22 does not disappear with dry etching. The state up to here is depicted in FIG. 3.

Figure 4:
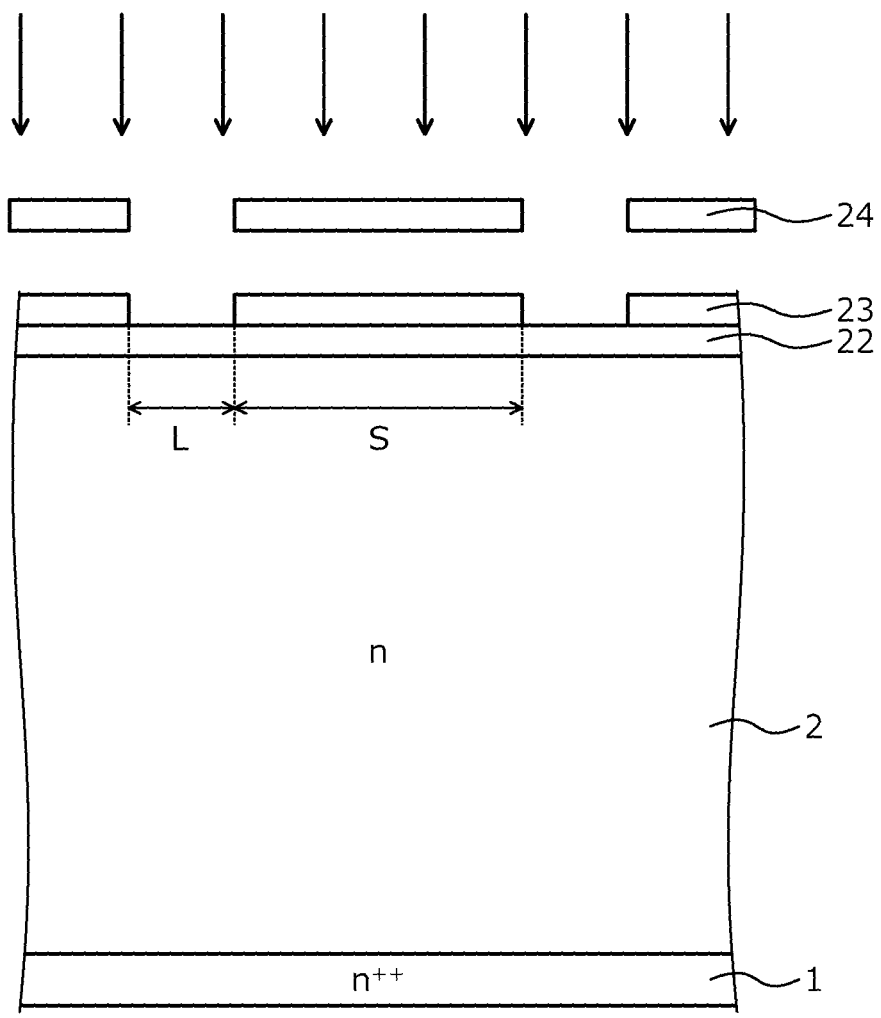
FIG. 4 is a cross-sectional view (part 3) of the silicon carbide semiconductor device according to the embodiment during manufacture.

Next, a trench region is patterned by application of a photoresist and exposure with a photomask (step S3). A photoresist 23 is applied on the oxide film 22, exposure using a photomask 24 is performed, and a region of the trench 19 is patterned. For example, a width L of the trench 19 and an interval S of the trench 19, for example, are 3 μm and 3 μm, respectively. Further, a thickness of the photoresist 23 is a thickness sufficient to ensure etching of the oxide film 22. The state up to here is depicted in FIG. 4.

Figure 5:
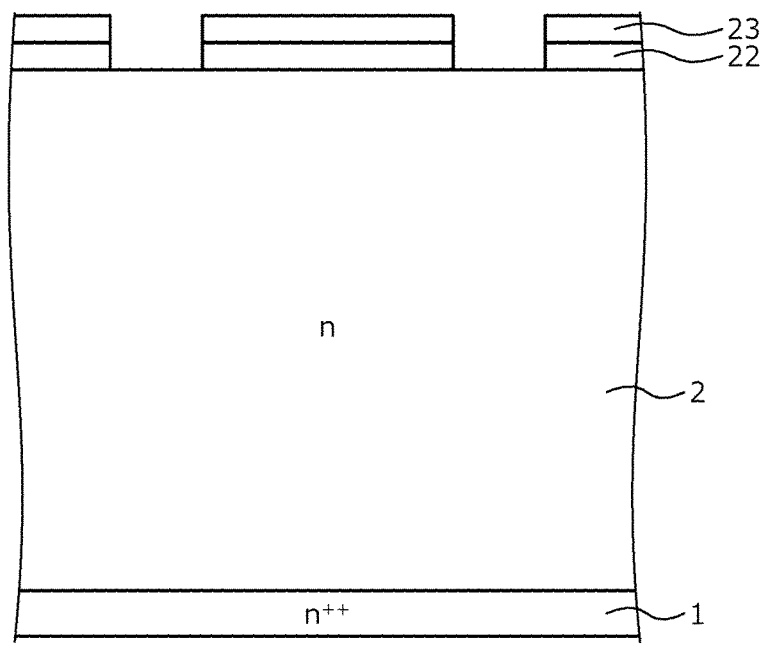
FIG. 5 is a cross-sectional view (part 4) of the silicon carbide semiconductor device according to the embodiment during manufacture.

Next, the oxide film is dry etched (step S4). The photoresist 23 is used as a mask and the oxide film 22 is dry etched until the n-type drift layer 2 is exposed. The state up to here is depicted in FIG. 5.

Figure 6:
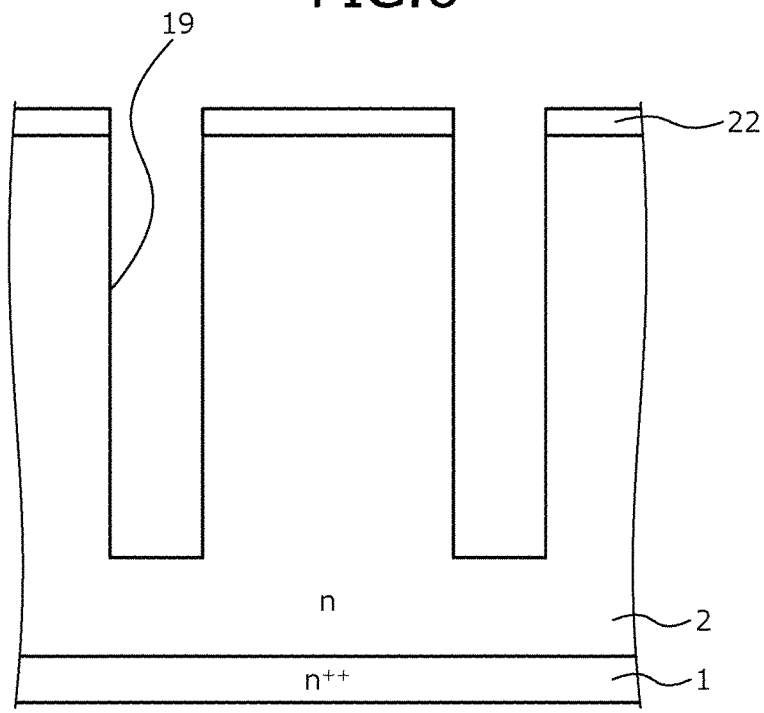
FIG. 6 is a cross-sectional view (part 5) of the silicon carbide semiconductor device according to the embodiment during manufacture.

Next, the photoresist is removed and the trench is formed (step S5). The photoresist 23 is removed, the oxide film 22 that has been patterned is used as a mask, and the n-type drift layer 2 is dry etched to a predetermined depth (for example, 20 to 25 µm), whereby the trench 19 is formed. In the trench etching, an occurrence of side etching and a sub-trench is suppressed as much as possible by, for example, a gas containing sulfur hexafluoride ($SF_6$)/oxygen ($O_2$)/argon (Ar). The state up to here is depicted in FIG. 6.

Figure 7:
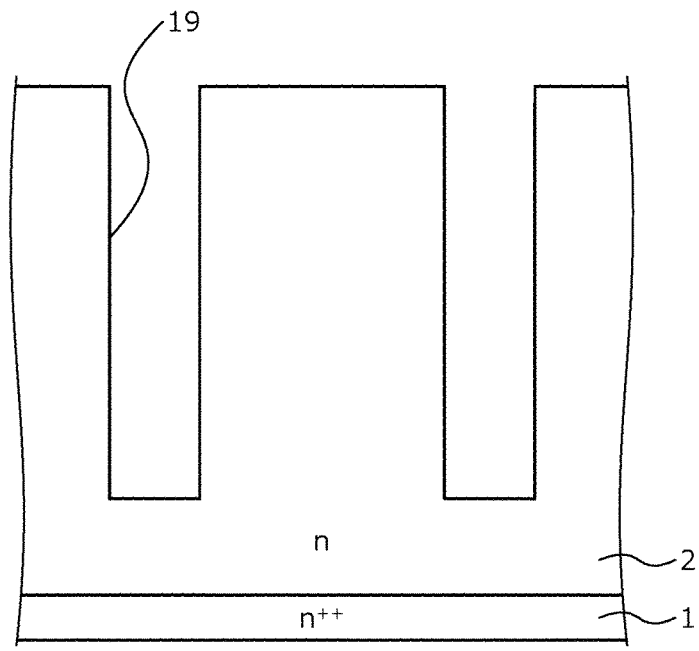
FIG. 7 is a cross-sectional view (part 6) of the silicon carbide semiconductor device according to the embodiment during manufacture.

Next, the oxide film is removed (step S6). The oxide film 22 used as a mask is removed using hydrogen fluoride (HF), etc., and further cleaning is performed well. The state up to here is depicted in FIG. 7.

Figure 8:
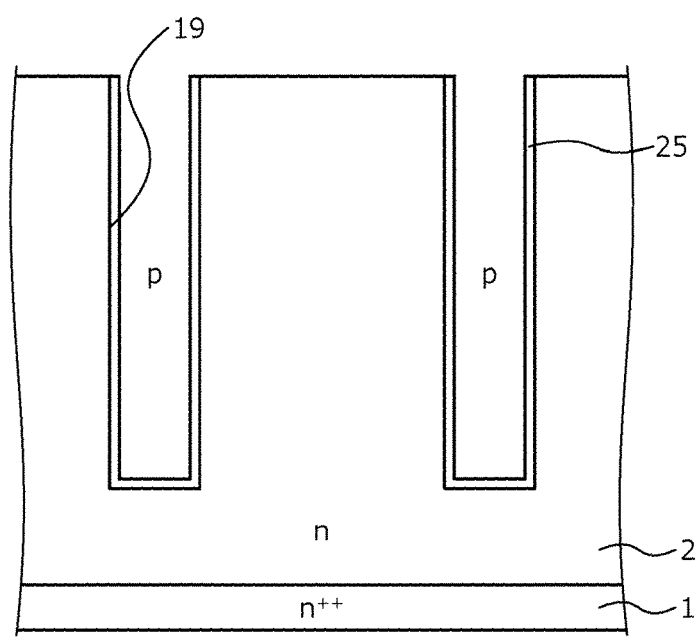
FIG. 8 is a cross-sectional view (part 7) of the silicon carbide semiconductor device according to the embodiment during manufacture.

Next, a p-type epitaxial film of about 0.2 µm is formed by a first dopant (step S7). The substrate is placed in a CVD apparatus capable of growing a p-type epitaxial film 25 containing SiC; hydrogen ($H_2$) gas is introduced into a carrier gas; and silane ($SiH_4$), propane ($C_3H_8$), hydrogen chloride (HCl), and TMA are introduced as a deposition gas. Flowrates of the gases are: a $SiH_4$ flowrate of 36 standard cubic centimeters per minute (sccm), a $C_3H_8$ flowrate of 12 sccm, an HCl flowrate of 1.8 standard liters per minute (slm), and a TMA flowrate of 6 sccm. The p-type epitaxial film 25 doped with TMA at a sidewall of the trench 19 is grown at a temperature of 1650 degrees C. to a thickness of about 0.2 µm. Here, although Al is used as the first dopant, B may be used. The state up to here is depicted in FIG. 8.

Figure 9:
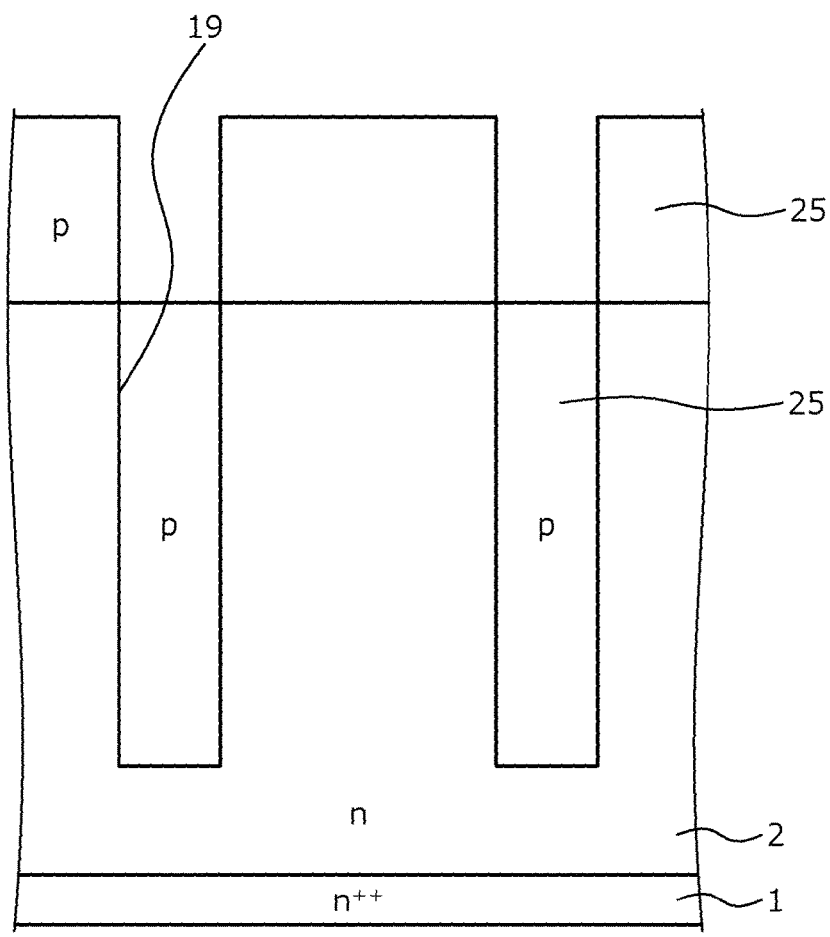
FIG. 9 is a cross-sectional view (part 8) of the silicon carbide semiconductor device according to the embodiment during manufacture.

Next, a second dopant is added and a p-type epitaxial film is formed (step S8). Subsequently, as a second dopant, introduction of an n-type dopant, e.g., nitrogen gas, which is incorporated at an atom position different from that of the first dopant begins from 0.1 sccm, and after four hours (deposition completion period) at a temperature of 1650 degrees C., the flowrate is gradually increased to become 2 sccm. A flowrate of nitrogen gas is adjusted so that concentration distribution in the trench 19 may be decreased. At this time, although the nitrogen flowrate and period are arbitrary, adjustment and introduction are such that Al concentration is not locally high. Here, although nitrogen is used as a second dopant, a different dopant, for example, phosphorus (P) may be used provided the dopant is an n-type dopant that is incorporated at an atom position different from that of the first dopant. Further, nitrogen is gradually increased because with only TMA, the p-type concentration increases with proximity to a center of the trench 19. With such a method, the first dopant and the second dopant are embedded in the trench 19 without voids, thereby forming the p-type epitaxial film 25. The state up to here is depicted in FIG. 9.

Figure 10:
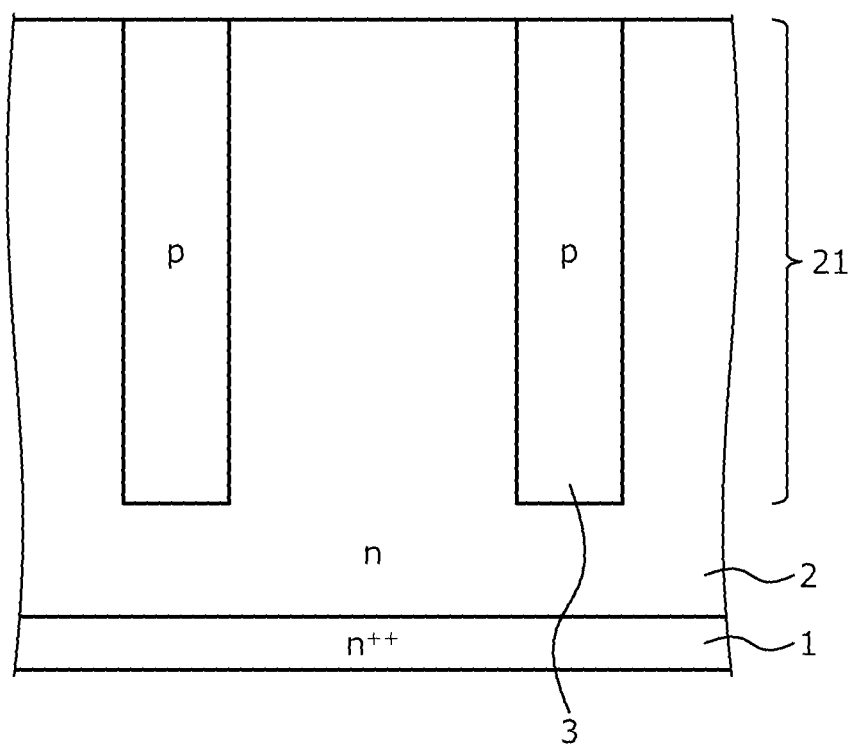
FIG. 10 is a cross-sectional view (part 9) of the silicon carbide semiconductor device according to the embodiment during manufacture.

Next, the p-type epitaxial film is ground (step S9). The substrate is removed from the CVD apparatus and thereafter, the p-type epitaxial film 25, which is unnecessary, is ground until the SJ layer (constituting the parallel pn layer) is exposed at the surface, whereby planarization is performed without hindering fabrication of the device. For example, rough polishing (primary polishing) and CMP polishing are performed. As a result, the p-type pillar region (first semiconductor region of a second conductivity type) 3 is formed. The state up to here is depicted in FIG. 10.

At this point, the SJ layer of the silicon carbide semiconductor device according to the embodiment is formed. When the first dopant is embedded in the trench 19 and the p-type epitaxial film 25 is formed, n-type nitrogen or phosphorus (P) is introduced as the second dopant while the flowrate thereof is arbitrarily controlled. Therefore, in the p-type epitaxial film 25, a high concentration occurring near the center of the trench 19 may be suppressed.

Figure 13:
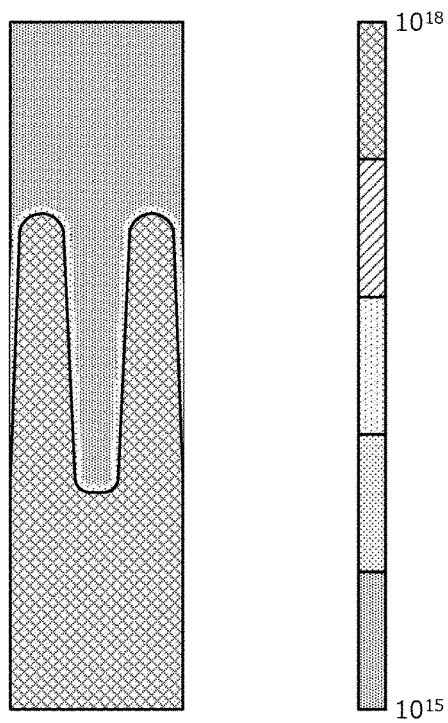
FIG. 13 is a schematic diagram of a scanning microwave micrograph of a p-type epitaxial film of the silicon carbide semiconductor device according to the embodiment.
Figure 16:
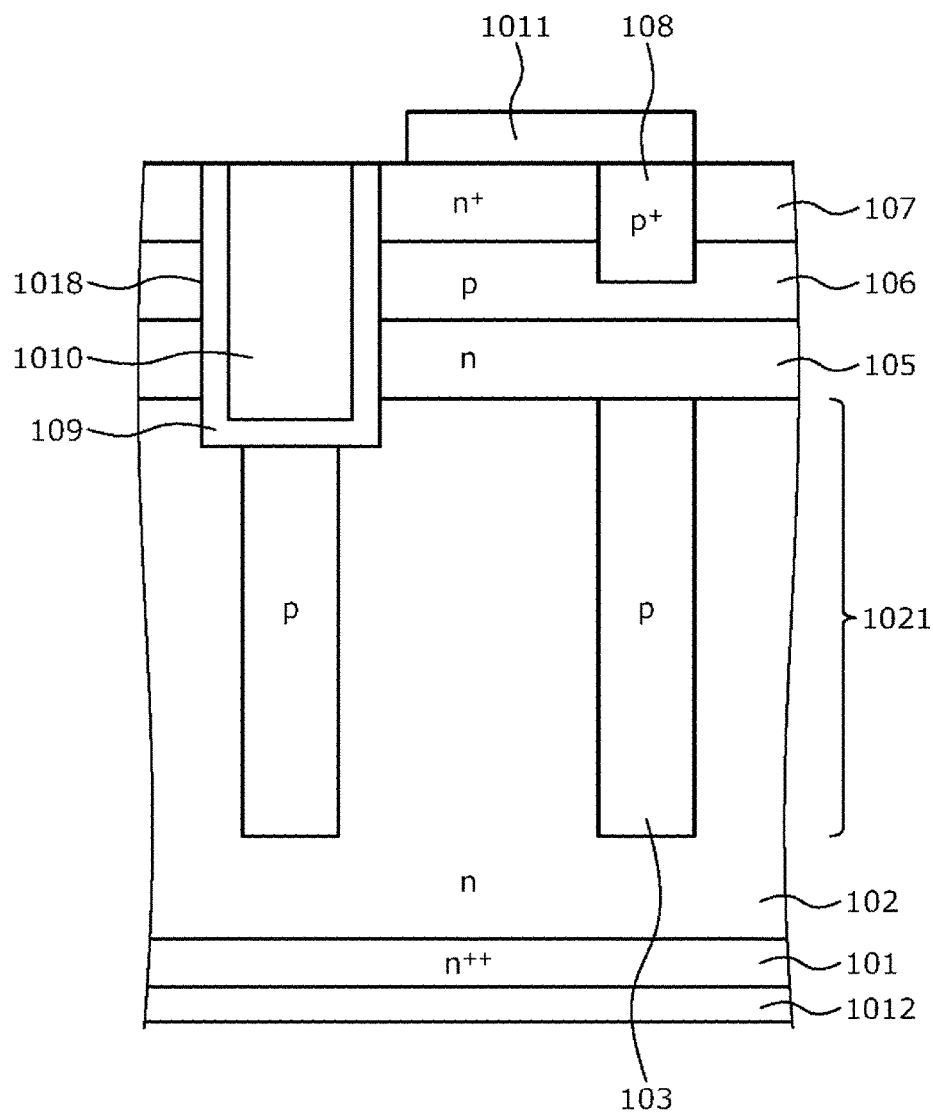
FIG. 16 is a cross-sectional view of a structure of a conventional superjunction MOSFET.
Figure 17:
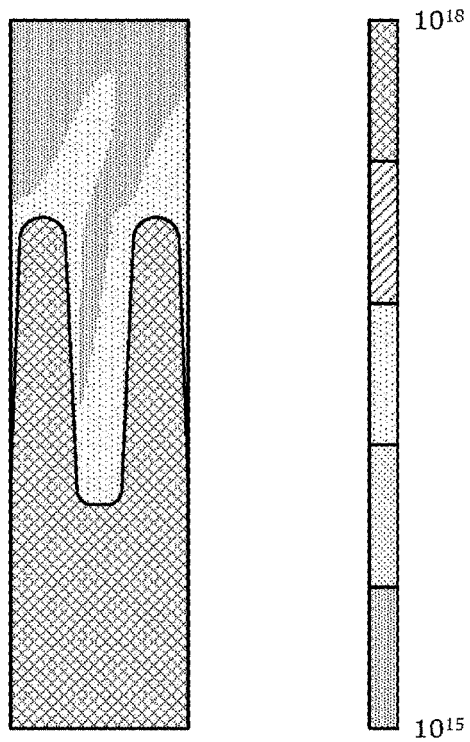
FIG. 17 is a schematic diagram of a scanning microwave micrograph of a p-type epitaxial layer of a conventional superjunction MOSFET.
Figure 18:
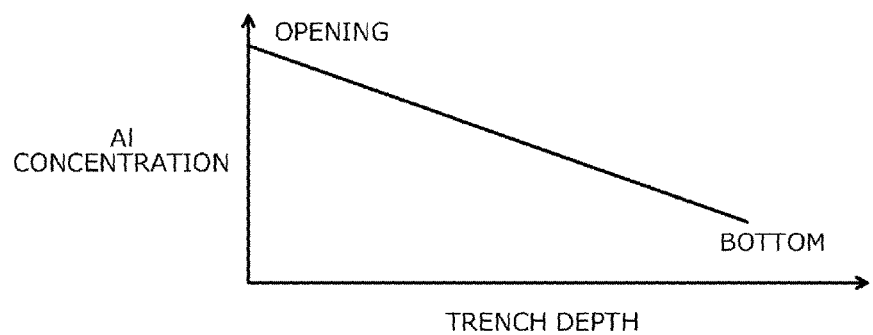
FIG. 18 is a graph depicting a relationship of trench depth and Al concentration.

FIG. 13 is a schematic diagram of a scanning microwave micrograph of the p-type epitaxial film of the silicon carbide semiconductor device according to the embodiment. As depicted in FIG. 13, in a region corresponding to the p-type epitaxial film 25, the embedded part overall has a carrier concentration of an exponential value of the 15th power (e.g., about $0.5 \times 10^{16}$ to $1.0 \times 10^{16}$) without any region of a particularly high carrier concentration. In FIG. 13, similarly to FIG. 16, in a sample for SMM analysis, the trench is formed directly in the $n^{++}$-type semiconductor substrate 1 and the p-type epitaxial film 25 is re-embedded and therefore, a concentration of a substrate part is an exponential value of the 18th power or more.

Figure 14:
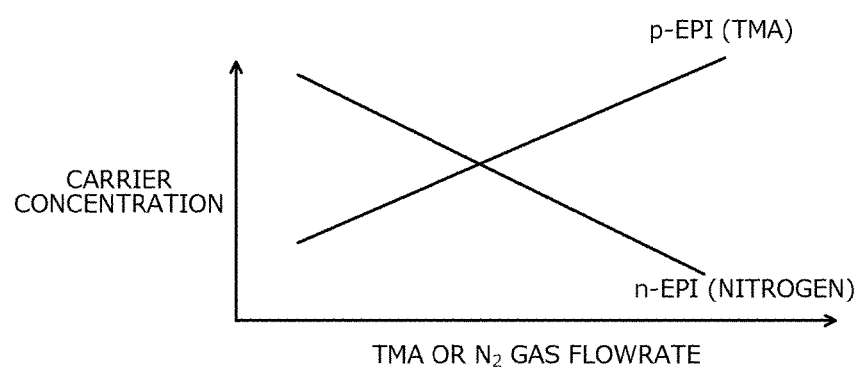
FIG. 14 is a graph depicting a relationship of carrier concentration and gas amount of gas species introduced as a dopant.

FIG. 14 is a graph depicting a relationship of carrier concentration and gas amount of gas species introduced as a dopant. As depicted in FIG. 14, carrier concentration increases with increases in the flowrate of a p-type dopant and the carrier concentration decreases with increases in an n-type dopant. Thus, when a p-type dopant and an n-type dopant are introduced concurrently, the p-type dopant and the n-type dopant may cancel each other. Therefore, the p-type impurity concentration becoming high near the center of the trench 19 is canceled by the incorporation of nitrogen in the p-type epitaxial film 25, enabling the carrier concentration in the trench 19 to be made as uniform as possible.

Figure 15:
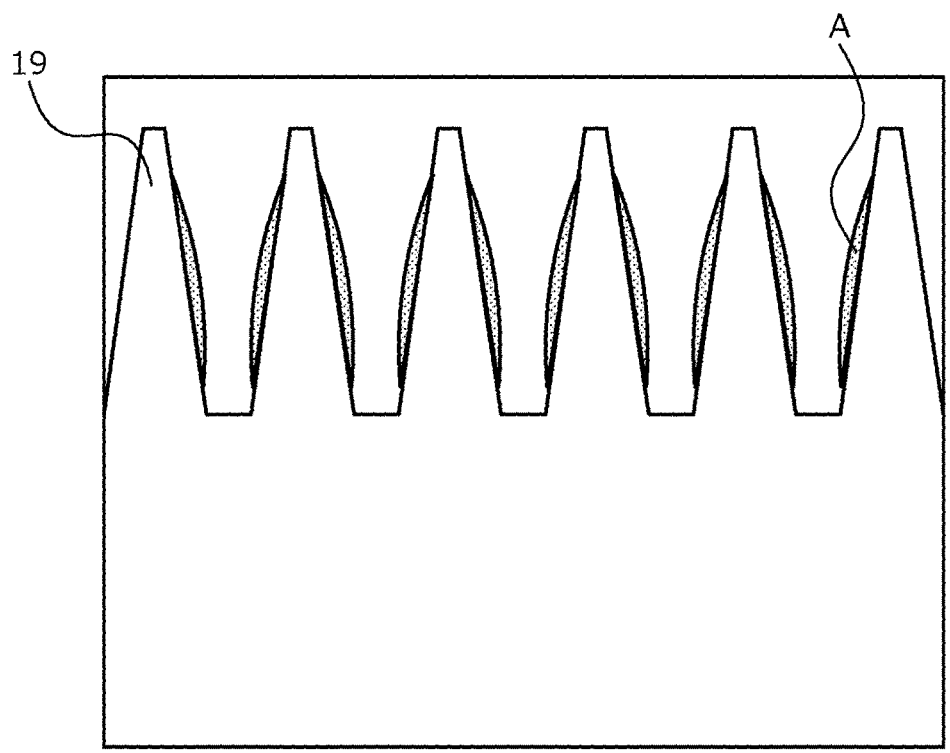
FIG. 15 is a schematic diagram of a resistance micrograph of the silicon carbide semiconductor device according to the embodiment.

FIG. 15 is a schematic diagram of a resistance micrograph of the silicon carbide semiconductor device according to the embodiment. Scanning spreading resistance microscopy (SSRM) is microscopy that scans a surface of a sample by a conductive probe and measures resistance value distribution 2-dimensionally to thereby visualize spreading resistance directly beneath the probe. Therefore, a resistance micrograph enables semiconductor dopant concentration distribution to be evaluated. As depicted in FIG. 15, in a vicinity (indicated by reference symbol A) (up to about 0.2 µm) of a sidewall of the trench 19, nitrogen is excessively incorporated because an m face that is the sidewall of the trench tends to incorporate nitrogen at the time of epitaxial growth due to the Si face constituting a bottom of the trench and thus, nitrogen in the CVD apparatus is incorporated into the sidewall. When nitrogen is introduced from the beginning, nitrogen is further incorporated near the sidewall of the trench and the carrier concentration distribution degrades. Therefore, like step S8 described above, the method may be such that nitrogen is not introduced at an initial stage of embedded growth of the p-type epitaxial film 25.

Up to here, formation of the SJ layer of the silicon carbide semiconductor device according to the flowchart of FIG. 1 has been described. Next, formation of a MOS structure of the silicon carbide semiconductor device will be described. On a surface of the n-type drift layer 2, an n-type CS layer 5 is formed by epitaxial growth. The higher an impurity concentration of the n-type CS layer 5 is, the higher a carrier injection enhancement (IE) effect is and therefore, the n-type CS layer 5 may be formed so that an impurity concentration thereof is higher than an impurity concentration of the n-type drift layer 2.

Figure 11:
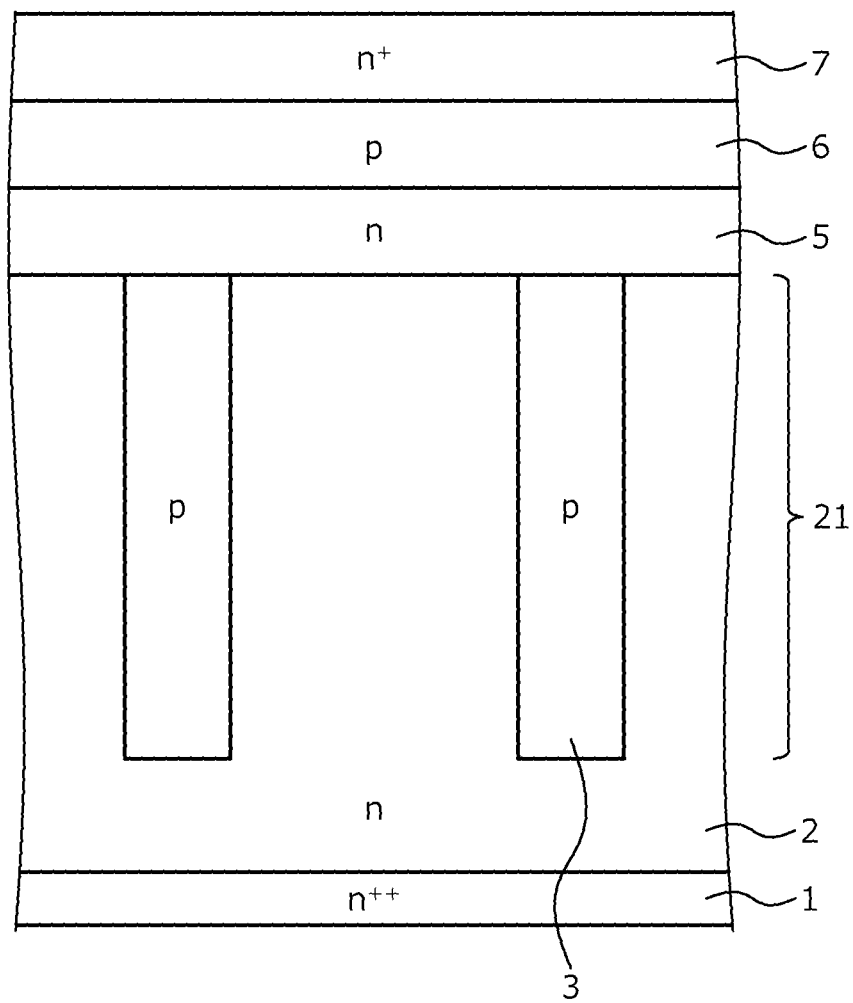
FIG. 11 is a cross-sectional view (part 10) of the silicon carbide semiconductor device according to the embodiment during manufacture.

Next, the p-type base layer 6 is formed on a surface of the n-type CS layer 5 by epitaxial growth. Next, an $n^+$-type source region 7 is formed on a surface of the p-type base layer 6, by epitaxial growth and has an impurity concentration that is higher than an impurity concentration of the n-type CS layer 5. The state up to here is depicted in FIG. 11.

Next, on a surface of the n$^+$-type source region 7, a non-depicted ion implantation mask having a predetermined opening formed by a photolithography technique is formed using, for example, an oxide film. Ion implantation of a p-type impurity is performed using the ion implantation mask as a mask and in a surface layer of the n$^+$-type source region 7, a p$^+$-type contact region 8 having an impurity concentration higher than an impurity concentration of the p-type base layer 6 is formed. Next, the ion implantation mask is removed.

Next, a trench 18 penetrating the n$^+$-type source region 7, the p-type base layer 6 and the n-type CS layer 5 and reaching inside the n-type drift layer 2 is formed by photolithography and etching. An oxide film is used for a mask at the time of trench formation. Next, isotropic etching for removing damage of the trench 18 and hydrogen annealing for rounding corners of an opening of the trench 18 and a bottom of the trench 18 may be performed. One among the isotropic etching and the hydrogen annealing may be performed. Further, after the isotropic etching is performed, the hydrogen annealing may be performed. The hydrogen annealing is performed at a temperature of, for example, 1500 degrees C.

Next, activation annealing is performed with respect to the ion implanted regions. For example, the activation annealing is performed at a temperature of 1700 degrees C. As a result, impurities ion implanted in the p$^+$-type contact region 8 are activated.

Figure 12:
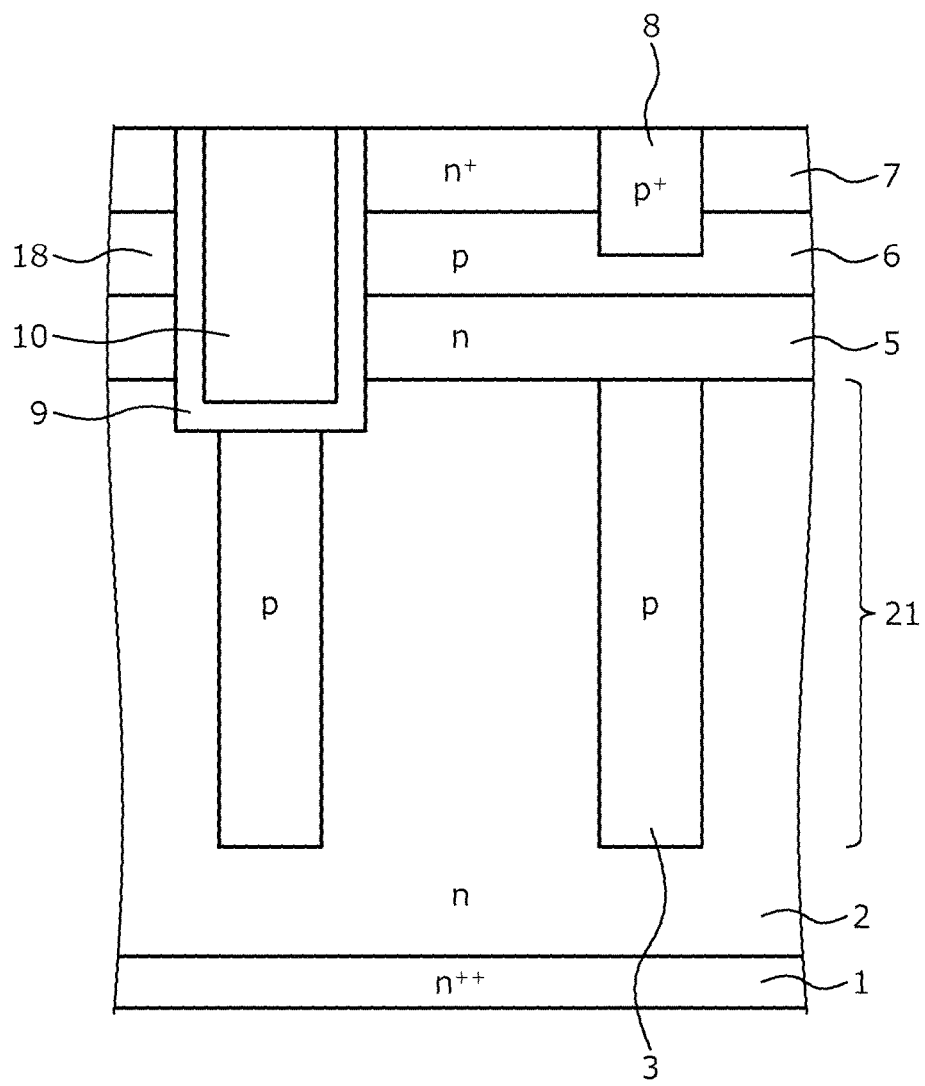
FIG. 12 is a cross-sectional view (part 11) of the silicon carbide semiconductor device according to the embodiment during manufacture.

Next, along a front surface of a silicon carbide base and an inner wall of the trench 18, a gate insulating film 9 is formed. Next, for example, poly-silicon is deposited so as to be embedded in the trench 18 and etching is performed so that the poly-silicon in the trench 18 and constituting a gate electrode 10 remains. At this time, etch-back and etching so as to leave the poly-silicon farther inside than a base surface part may be performed, or patterning and etching may be performed, whereby the poly-silicon protrudes outward from the base surface part. The state up to here is depicted in FIG. 12.

Next, a non-depicted interlayer insulating film is formed on the entire front surface of the silicon carbide base so as to cover the gate electrode 10. The interlayer insulating film is formed by, for example, a non-doped silicate glass (NSG), phosphosilicate glass (PSG), a borophosphosilicate glass (BPSG), a high temperature oxide (HTO), or any combination thereof. Next, the interlayer insulating film and the gate insulating film 9 are patterned and a contact hole is formed, exposing the n$^+$-type source region 7 and the p$^+$-type contact region 8.

Next, at a front surface side of a semiconductor base, a nickel (Ni) film is formed by, for example, a sputtering technique. Next, by sintering (heat treatment), a silicon carbide semiconductor part (the n$^+$-type source region 7 and the p$^+$-type contact region 8) and the nickel film are cause to react, forming a nickel silicide film, whereby an ohmic contact with the silicon carbide semiconductor part is formed. Between the interlayer insulating film and the nickel film, a TiN (titanium nitride) film may be formed.

Next, a source electrode 11 is formed so as to be in contact with the n$^+$-type source region 7. The source electrode 11 may be formed so as to cover the nickel silicide film or may be left only in the contact hole.

Next, a source electrode pad is formed so as to be embedded in the contact hole. A part of a metal layer deposited to form the source electrode pad may be used as a gate pad. On a rear surface of the n$^{++}$-type semiconductor substrate 1, at a contact part of a drain electrode 12, a metal film such as a nickel (Ni) film, a titanium (Ti) film, or a combination of stacked plural films thereof is formed using sputtering deposition or the like. Thereafter, annealing such as rapid thermal annealing (RTA) is performed so as to convert the metal film into a silicide and form an ohmic contact. Thereafter, a thick film such as a stacked film of, for example, a Ti film, a Ni film, a gold (Au) film stacked in order stated is formed by electron beam (EB) deposition, whereby the drain electrode 12 is formed.

In the epitaxial growth and ion implantation described above, as an n-type impurity (n-type dopant) for silicon carbide, for example, nitrogen (N), phosphorus (P), arsenic (As), antimony (Sb), or the like may be used. As a p-type impurity (p-type dopant) for silicon carbide, for example, aluminum (Al), boron (B), gallium (Ga), indium (In), thallium (Tl), or the like may be used. In this manner, the silicon carbide semiconductor device of the embodiment is completed.

As described, according to the embodiment, when the first dopant is embedded in the trench and the p-type epitaxial film is formed, the flowrate of n-type nitrogen or phosphorus is arbitrarily controlled while the nitrogen or phosphorus is introduced as the second dopant. As a result, the p-type epitaxial film may be suppressed from having a high concentration near the center of the trench. Therefore, design of the semiconductor device is facilitated and, the performance and the yield of the semiconductor device may be further improved.

Further, nitrogen is not introduced at the initial stage of embedded growth of the p-type epitaxial film. As a result, without nitrogen being further incorporated or the carrier concentration distribution degrading near the sidewall of the trench, instances in which the carrier concentration distribution of the epitaxial layer in the trench becomes non-uniform may be reduced.

In the embodiments of the present invention, various modifications within a range not departing from the spirit of the present invention are possible. For example, dimensions, impurity concentrations, etc. of regions may be variously set according to necessary specifications. Further, in the embodiments, although a MOSFET is described as an example, without limitation hereto, wide application is possible to various silicon carbide semiconductor devices having a superjunction structure such as, for example, diodes. Further, in the embodiments, although the first conductivity type is an n-type and the second conductivity type is a p-type, the present invention is similarly implemented when the first conductivity type is a p-type and the second conductivity type is an n-type.

INDUSTRIAL APPLICABILITY

As described, silicon carbide semiconductor device and the method of manufacturing a silicon carbide semiconductor device according to the embodiments of the present invention are useful in power semiconductor devices used in power converting equipment and power supply devices such as in industrial machines, and are particularly suitable for silicon carbide semiconductor devices having a superjunction structure.

EXPLANATIONS OF LETTERS OR NUMERALS 1 n$^{++}$-type semiconductor substrate
2 n-type drift layer
3 p-type pillar region
5 n-type CS layer 6 p-type base layer
7 n⁺-type source region
8 p⁺-type contact region
9 gate insulating film
10 gate electrode
11 source electrode
12 drain electrode
18 trench
19 trench of p-type pillar region
21 SJ layer
22 oxide film
23 photoresist
24 photomask
25 p-type epitaxial film

The invention claimed is:

1. A silicon carbide semiconductor device comprising
a silicon carbide semiconductor substrate of a first conductivity type, having a front surface; and
a parallel pn layer having:
  a first semiconductor layer of the first conductivity type provided on the front surface of the silicon carbide semiconductor substrate; and
  a first semiconductor region of a second conductivity type embedded in a trench that is provided in the first semiconductor layer, from a surface of the first semiconductor layer, wherein
a depth of the trench is at least three times a width of the trench, and
the first semiconductor region contains
  a first dopant of the second conductivity type determining a conductivity type of the first semiconductor region, and
  a second dopant of the first conductivity incorporated at an atom position different from that of the first dopant, a carrier concentration of the first semiconductor region being uniform.

2. The silicon carbide semiconductor device according to claim 1, wherein the carrier concentration of the first semiconductor region is in a range of $1\times10^{15}/cm^3$ to $5\times10^{17}/cm^3$.

3. A method of manufacturing a silicon carbide semiconductor device, the method comprising:
  forming a first semiconductor layer of a first conductivity type on a front surface of a silicon carbide semiconductor substrate of the first conductivity type;
  forming a trench in the first semiconductor layer, from a surface of the first semiconductor layer, the trench having a depth at least three times a width of the trench; and
  forming a first semiconductor region of a second conductivity type in the trench,
  by introducing a first dopant of the second conductivity type and a gas containing a second dopant of the first conductivity type that is incorporated at an atom position different from that of the first dopant.

4. The method according to claim 3, wherein forming a first semiconductor region further includes
  depositing a portion of the first semiconductor region with introducing with the first dopant and without the second dopant until a thickness of the portion of the first semiconductor region at a side wall of the trench becomes 0.2 μm, and
  after the thickness of the portion of the first semiconductor region becomes 0.2 μm, forming the rest of the first semiconductor region by introducing the first dopant and the second dopant.

5. The method according to claim 4, wherein forming the rest of the first semiconductor region includes gradually increasing a flowrate of the gas containing the second dopant from a start of supplying the second dopant until formation of the first semiconductor region is complete.

6. The method according to claim 4, wherein forming the rest of the first semiconductor region includes supplying the second dopant having an amount to be less than an amount of the first dopant, thereby forming the first semiconductor region having a carrier concentration of the first semiconductor region being in a range of $1\times10^{15}/cm^3$ to $5\times10^{17}/cm^3$.

* * * * *